(12) United States Patent
Lo et al.

(10) Patent No.: US 6,456,126 B1
(45) Date of Patent: Sep. 24, 2002

(54) FREQUENCY DOUBLER WITH POLARITY CONTROL

(75) Inventors: Jack Siu Cheung Lo; Shankar Lakkapragada, both of San Jose; Shi-dong Zhou, Milpitas, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/865,871

(22) Filed: May 25, 2001

(51) Int. Cl.[7] .............................................. H03B 19/00
(52) U.S. Cl. ...................................... 327/116; 327/122
(58) Field of Search ................................ 327/116, 122, 327/119, 112, 407, 408, 409

(56) References Cited

U.S. PATENT DOCUMENTS

| | | | |
|---|---|---|---|
| 5,331,226 A | | 7/1994 | Goetting et al. ............... 326/44 |
| 5,399,924 A | | 3/1995 | Goetting et al. ............... 326/45 |
| 6,008,676 A | * | 12/1999 | Lee et al. ...................... 327/116 |
| 6,091,270 A | * | 7/2000 | Cauchy .......................... 327/116 |
| 6,118,313 A | * | 9/2000 | Yakabe et al. ................ 327/116 |
| 6,262,607 B1 | * | 7/2001 | Suzuki .......................... 327/112 |
| 6,285,226 B1 | * | 9/2001 | Nguyen ........................ 327/122 |

* cited by examiner

Primary Examiner—Timothy P. Callahan
Assistant Examiner—Linh Nguyen
(74) Attorney, Agent, or Firm—Edel M. Young; William L. Paradice, III

(57) ABSTRACT

An integrated clock doubler and polarity control circuit are described. The circuit provides high speed response between an input signal and an output signal, achieving clock doubling by passing the input signal through a delay circuit and using the output of the delay circuit to select between two paths for inverting or not inverting the input signal to produce the output signal. In one embodiment, the inverting path is a CMOS inverter with input terminal receiving the input signal, output terminal providing the output signal, and power terminals controlled by the delay circuit.

12 Claims, 5 Drawing Sheets

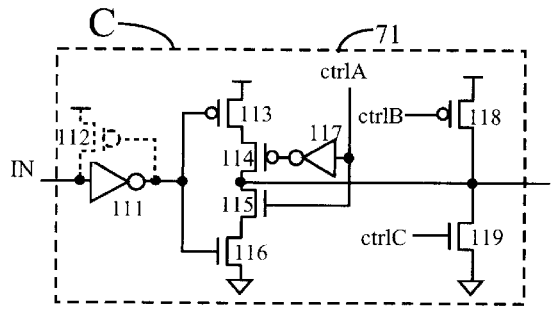
FIG. 10
| ctrlA | ctrlB | ctrlC | mode |
|---|---|---|---|
| 0 | 0 | 0 | pull up |
| 0 | 1 | 1 | pull down |
| 1 | 1 | 0 | clock doubler |
other states not allowed
FIG. 10a
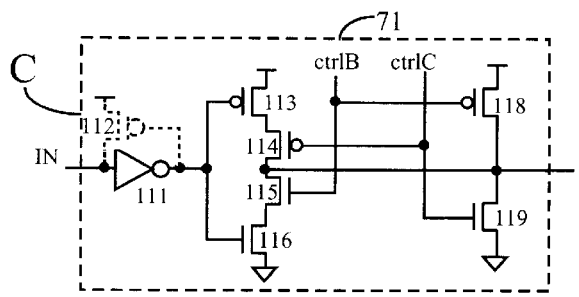
FIG. 11
| ctrlB | ctrlC | mode |
|---|---|---|
| 0 | 0 | pull up |
| 1 | 0 | clock doubler |
| 1 | 1 | pull down |
| 0 | 1 | not allowed |
FIG. 11a
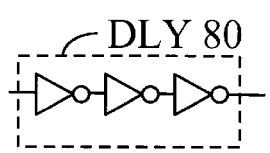
FIG. 12
Prior Art
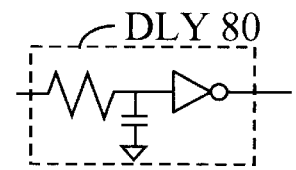
FIG. 13
Prior Art
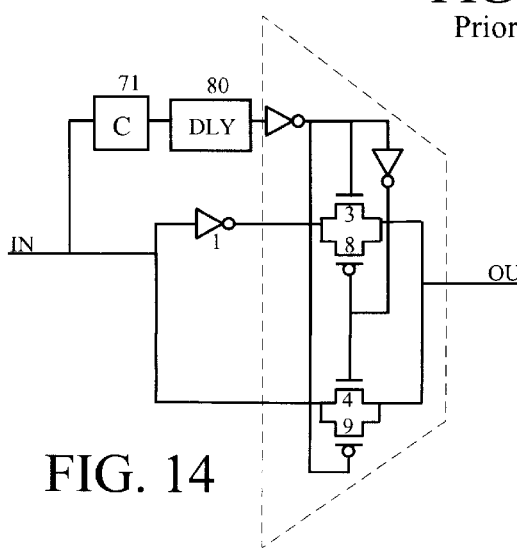
FIG. 14
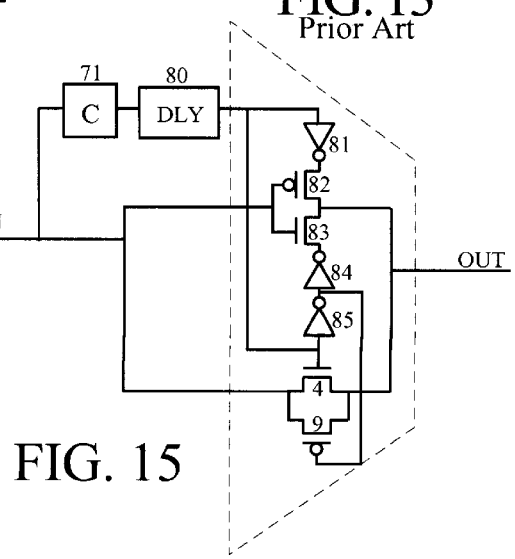
FIG. 15

FREQUENCY DOUBLER WITH POLARITY CONTROL

FIELD OF THE INVENTION

The invention relates to CMOS integrated circuits and particularly to fast optional signal inversion or polarity control.

BACKGROUND

In this description, equivalent elements are given the same reference numbers throughout the figures and are not described more than once.

In programmable logic devices, it is often useful to offer optional inversion of a signal so that a user may invert the polarity of the signal but only when desired. FIG. 1 shows a well known circuit for applying both inverted and non-inverted versions of an input signal IN to a multiplexer M. A select signal SEL determines whether the multiplexer will provide the inverted or non-inverted input signal as the output signal OUT.

FIG. 2 shows one implementation of this circuit. Inverter 1 causes the inverted signal to arrive at multiplexer M at a later time than does the non-inverted signal. Also, inverter 2 causes the non-inverted signal path through transistor 4 to switch at a later time than does the inverted signal path through transistor 3. As the speed of signals increases, the fact that the inverted and non-inverted signals arrive at multiplexer M at different times becomes significant.

In order to increase internal operating speed, circuit designers sometimes use clock frequency doublers such as shown in FIG. 3. These circuits cause pulses to be generated on both rising and falling edges of the input signal. The circuit of FIG. 3 provides a low output signal whenever the input signal has been in a steady state long enough that the input signal IN has propagated through inverters 31, 32, and 33 to NAND gate 34 and NOR gate 35 so that both NAND gate 34 and NOR gate 35 receive differing versions of input signal IN. Thus NAND gate 34 outputs a high steady state signal and NOR gate 35 outputs a low steady state output signal. Since inverter 36 inverts the NOR gate signal again, both inputs to NAND gate 37 in this steady state are high, and NAND gate 37 outputs a low signal. But when input signal IN switches from low to high, both inputs to NAND gate 34 go temporarily high, so NAND gate 34 outputs a low signal, causing NAND gate 37 to output a high OUT signal until the signal propagates through inverters 31, 32, and 33 and NAND gate 34 again goes high. Similarly, when input signal IN switches from high to low, there is a period of time when the lower input to NOR gate 35 has gone low and the upper input to NOR gate 35 is still low, so that NOR gate 35 outputs a high signal, causing inverter 36 to provide a low signal to NAND gate 37, thus causing NAND gate 37 to output a high OUT signal until the switching of inverters 31–33 has propagated and caused NAND gate 37 to again go low.

FIG. 4 shows the pulses in output signal OUT that occur on every transition of input clock signal IN, and illustrates that output signal OUT transitions twice as often as input signal IN.

Circuit designers sometimes want both the clock doubling function and the polarity select function. FIG. 5 shows a 3-to-1 multiplexer circuit M5 that combines the polarity select function of FIG. 1 with the clock doubler function of FIG. 3. In order to save power, pass transistor 6 is placed at the input of the clock doubler circuit. To isolate the clock doubler circuit when not in use, transistor 7 is placed at the output. To prevent floating of the input to inverter 31 when transistor 6 is off, a P-channel transistor 52 is provided, and in order to prevent transistors in inverter 31 from forming a conductive path in response to an intermediate input signal, a P-channel pull-up transistor 51 is provided to pull the input of inverter 31 all the way to Vcc when input signal IN is high. P-channel half-latch transistor 5 is optionally provided if needed to prevent the input of inverter 1 from remaining at an intermediate voltage. Three select signals SEL1, SEL2, and SEL3 are provided to control transistors 3, 4, and 7 respectively, and only one select signal is brought high to enable one of the paths through multiplexer M5.

However, the delay through the clock doubler circuit plus transistors 6 and 7 causes the circuit of FIG. 5 to be undesirably slow. The path that first produces low-to-high switching of output signal OUT is through transistor 6, NAND gate 34, NAND gate 37, and pass transistor 7. High-to-low switching requires the signal to propagate through transistor 6, NOR gate 35, inverter 36, NAND gate 37, and pass transistor 7, or a total of five devices. It would be desirable to offer the clock doubling function in combination with the polarity select function without incurring the kind of delay resulting from the circuit of FIG. 5.

SUMMARY OF THE INVENTION

In one embodiment, the invention achieves high speed switching between inverted and non-inverted paths from an input terminal to an output terminal by placing a CMOS inverter in the inverted path, and using a path selector that drives the two power terminals of the CMOS inverter as well as controlling the non-inverted path. When the path selector is in one state, the CMOS inverter is powered that it does not conduct a signal from input to output and the non-inverted path (a pass gate or a transmission gate) does conduct. When the path selector is in the other state, the CMOS inverter inverts the input signal to generate an output signal and the non-inverting path does not conduct.

In another embodiment, a clock doubling pulse generator is achieved by using a delay circuit for selecting between inverting and non-inverting paths, the delay circuit receiving the input signal, and responding to the input signal by switching state a period of time after the input signal has switched state. Since the delay circuit controls whether the signal is inverted or not, the state of the output signal changes quickly in response to a change in the input signal and then the output signal returns to its former state after the delay has passed. Thus the output signal switches state on every high and every low transition of the input signal, effectively doubling the switching frequency of the input signal.

According to another aspect of the invention, the polarity of the output signal with respect to the input signal is selectable. A pair of inverted and non-inverted paths provide an output signal in response to an input signal. As a clock-doubling feature of the invention, selection of one of the paths is made by a delay circuit that receives the input signal and changes the selection after a delay has passed.

The inverting and non-inverting paths may both be transmission gates. Or the non-inverting path may be a transmission gate and the inverting path may be a CMOS inverter with the sources of the P-channel and N-channel transistors driven by a select signal and its inverse. The select signal may be an independent polarity control signal or a delayed version of the input signal to achieve clock doubling.

The invention achieves very fast switching in response to an input signal and can therefore respond to higher frequency clock signals than can prior art circuits.

BRIEF DESCRIPTION OF THE DRAWINGS

FIGS. 10 and 11 shows two implementations of the polarity selector C shown in other figures.

FIGS. 10a and 11a show truth tables for the circuits of FIGS. 10 and 11, respectively.

FIGS. 12 and 13 show two circuits that can implement the delay elements shown in other figures.

FIGS. 14 and 15 show two embodiments of the invention that replace one or two pass transistors in the multiplexer with transmission gates.

DETAILED DESCRIPTION

Figure 1:
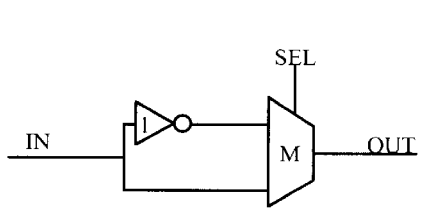
FIG. 1 shows a prior art polarity selector.
Figure 2:
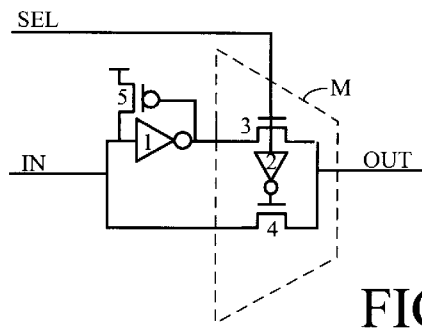
FIG. 2 shows an implementation of the structure of FIG. 1.
Figure 3:
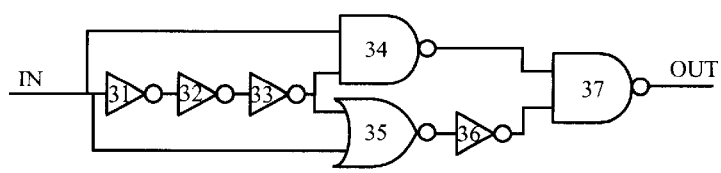
FIG. 3 shows a prior art structure for doubling clock signal frequency.
Figure 4:
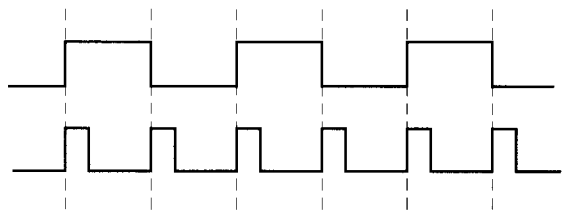
FIG. 4 shows the timing diagram of FIG. 3.
Figure 5:
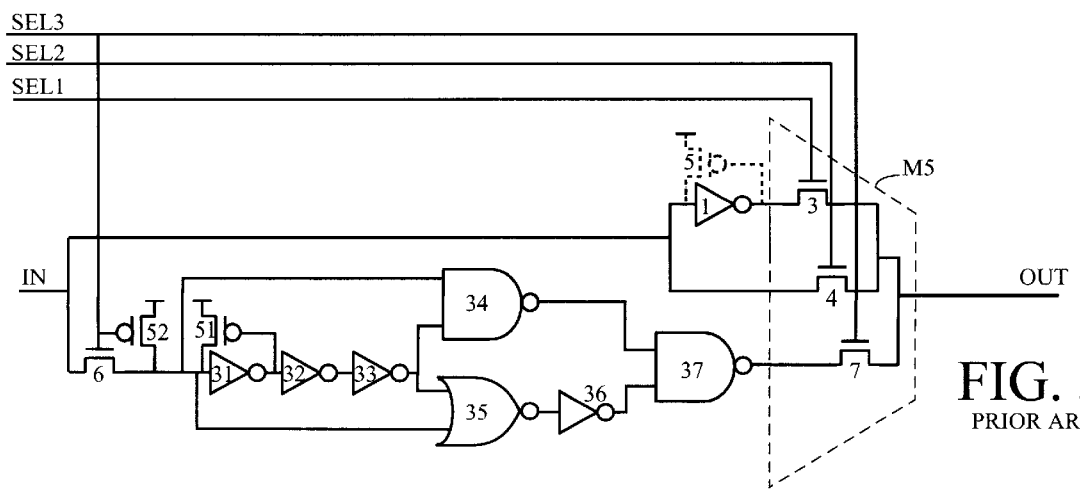
FIG. 5 shows a structure combining the polarity selector of FIG. 2 and the clock doubler of FIG. 3.
Figure 6:
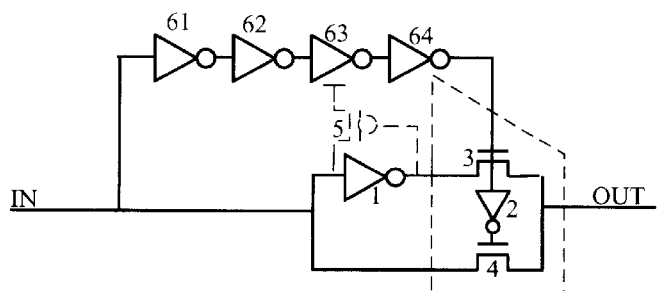
FIG. 6 shows a structure according to the invention for implementing a fast clock doubler (fast dual-edge pulse generator).

FIG. 6 shows a structure according to the invention for implementing a clock doubler with control of the two pass gates 3 and 4 provided by the string of inverters 61–64. This structure provides considerably faster switching than the structure of FIG. 3 as can be seen by the fact that in FIG. 3, the slowest path from input signal IN to output signal OUT passes through three devices 35, 36, and 37, whereas in FIG. 6, the slowest path from input signal IN to output signal OUT passes through two devices: inverter 1 and pass transistor 3.

Figure 7:
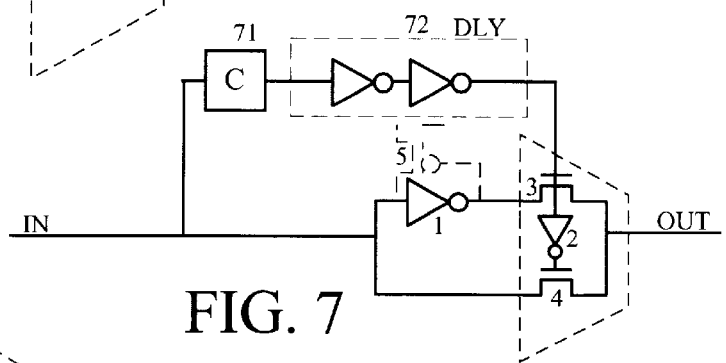
FIG. 7 shows a structure according to the invention for combining a polarity selector and a fast clock doubler.

The embodiment of FIG. 6 provides clock doubling but no selection of polarity. FIG. 7 offers both features. In FIG. 7, element 71 is a polarity and clock doubling selector, so a choice of clock polarity is available. Element 72 provides a delay. In FIG. 7, element 72 is shown as a string of two inverters, but may be implemented by a different delay circuit. And of course the amount of delay is selectable at the time the circuit is designed (though not at the time a user selects polarity). In order for the function of the circuit to be proper, in FIG. 7, the combination of polarity selector 71 and delay element 72 must invert the input signal an even number of times.

Figure 8:
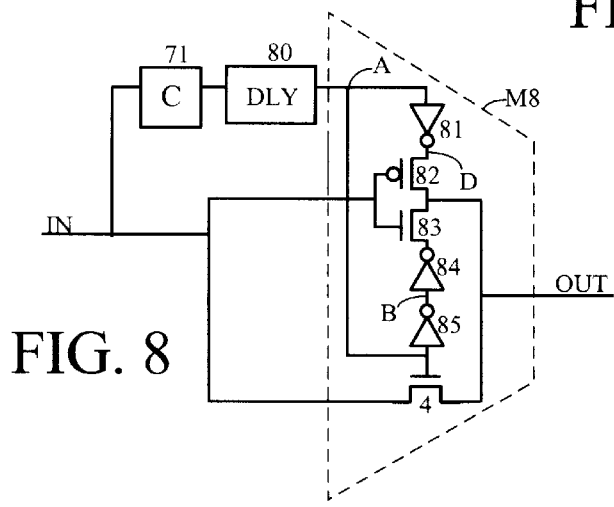
FIG. 8 shows an even faster structure according to the invention for combining a polarity selector and a fast clock doubler.

FIG. 8 illustrates another embodiment of the invention, again offering both clock doubling and polarity control. In FIG. 8, instead of forming the inverting path through inverter 1 and pass transistor 3, a CMOS inverter comprising transistors 82 and 83 is powered with a selectable power supply controlled by delay element 80. When delay element 80 is outputting a low signal, inverter 81 provides a high value to the source of P-channel transistor 82 and inverter 84 provides a low voltage to the source of N-channel transistor 84. Thus transistors 82 and 83 act as a CMOS inverter and invert input signal IN. The low output of delay element 80 also turns off transistor 4, so there is no contention at output terminal OUT. When delay element 80 is outputting a high signal, transistor 4 is on, and transistors 82 and 83 operate as a weak non-inverting buffer, providing the same output signal as pass transistor 4, so again there is no contention at output terminal OUT. In FIG. 8, the combination of polarity selector 71 and delay element 80 must invert input signal IN an odd number of times, since compared to FIG. 7 additional inverters 81 and 85 are in the control path and inverter 2 is missing. Thus when input signal IN has been low long enough to have propagated through elements 71 and 80, node A is high, and when input signal IN has been high long enough to have propagated through elements 71 and 80, node A is low. The output of the CMOS inverter comprising transistors 82 and 83 does not conflict with the low input signal IN being propagated through transistor 4. At either transition of input signal IN, there is a fast switching of output signal OUT. The clock doubling structure of FIG. 8 switches even faster than that of FIG. 7 at some expense of chip area.

Figure 8A:
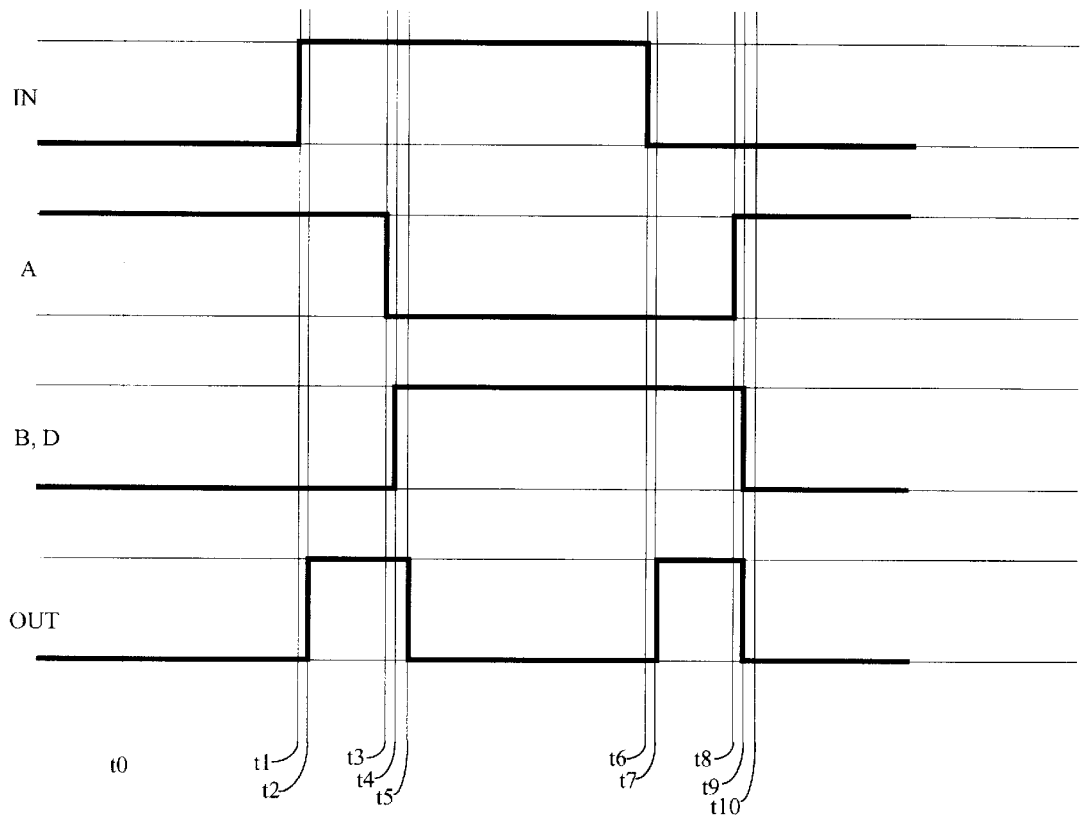
FIG. 8a shows a timing diagram for the circuit of FIG. 8.

FIG. 8a shows a timing diagram of the embodiment of FIG. 8. Certain nodes in FIG. 8 have been labeled with the letters A, B, and D. FIG. 8a shows switching of the signals at input node IN, at delay output node A, at inverter output nodes B and D, and at the output node OUT. At time t0, a steady state time, input signal IN is low, and has been low for a while. Polarity control element 71 is assumed to be operating in its clock doubling mode such that node A is high, which means nodes B and D are low, which means the CMOS structure comprising transistors 82 and 83 is non-inverting and transistor 4 is on. Thus output signal OUT is the same as input signal IN. At time t1, input signal IN goes high. This input signal propagates quickly through transistor 4, causing output signal OUT to go high at time t2. The high input signal IN has also started propagating through polarity control element 71 and delay element 72 so that at time t3, node A goes low. This causes inverters 82 and 85 to switch states so that at time t4 nodes B and D go high. Also at this time transistor 4 turns off and transistors 82 and 83 operate as a CMOS inverter. Thus input signal IN becomes inverted and at time t5 output signal OUT goes low. When input signal IN goes low at time t6, the CMOS inverter comprising transistors 82 and 83 switches quickly so that at time t7, output signal OUT goes high. Then when the result of input signal IN switching propagates to node A, at time t8 node A goes high, turning on transistor 4 at about the time nodes B and D go low. Thus at time t9, output signal OUT goes low even before transistor 84 goes high. This timing diagram illustrates the high speed benefit of a circuit according to the invention because the time delay between times t1 and t2 is very short, and the time delay between times t6 and t7 is also very short. As device sizes become smaller and circuits become faster, the delay between times t2 and t3 can be selected to be small so that very high frequency clock signals can be successfully processed.

Figure 9:
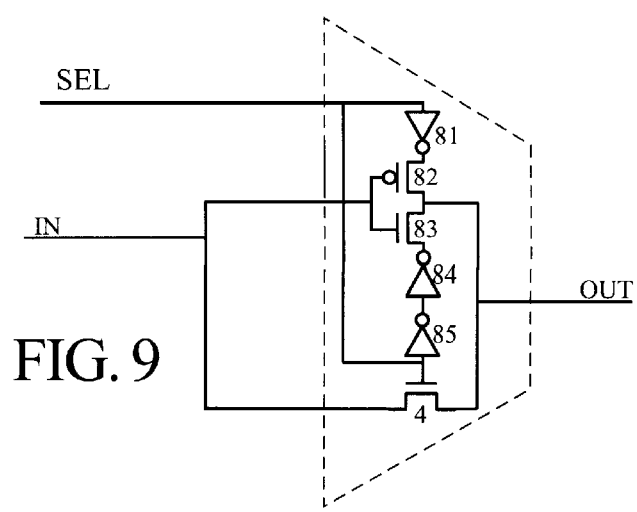
FIG. 9 shows an embodiment of the invention that provides very fast polarity selection.

FIG. 9 shows yet another embodiment of the invention, but this time without the clock doubling feature of FIGS. 6–8. In FIG. 9, the select signal SEL controls polarity of the connection from input signal IN to output signal OUT, but is not derived from input signal IN. The same high switching speed of FIG. 8 is also achieved.

FIG. 10 shows a structure for implementing polarity control circuit C used in FIGS. 7 and 8 (also FIGS. 14 and 15). The polarity control structure of FIG. 10 receives three control signals ctr1A, ctr1B, and ctr1c. Control signal ctr1A determines whether the clock doubler is being turned on or off. If ctr1A is high, transistors 114 and 115 are on and the clock doubling feature is being used. When ctr1A is low, control signals ctr1B and ctr1c allow steady state high and low signals to be provided to delay circuit 72 or delay circuit 80. FIG. 10a shows a truth table for the states of FIG. 10. When ctr1A, ctr1B, and ctr1C are all 0, transistor 118 is turned on, and polarity control circuit 71 outputs a high signal. If this signal passes through an odd number of inverters as shown in FIGS. 12 and 13, a low signal appears as the delay circuit output (for example at node A of FIG. 8). In the circuit of FIG. 8 this low signal places multiplexer M8 into an inverting mode. When ctr1A is low and ctr1B and ctr1c are both high, transistor 119 pulls down the output of circuit C, placing a structure such as FIG. 8 into a non-inverting mode. When ctr1A and ctr1B are high and ctr1C is low, transistors 118 and 119 are both off and the tristate inverter comprising transistors 113–116 is on, so the output of C switches in response to input signal IN, thus enabling the clock doubling feature.

FIG. 11 shows another structure similar to that of FIG. 10 for implementing polarity control circuit 71. In FIG. 11, only two control signals ctr1B and ctr1C are used. A high ctr1B signal turns on transistor 115 and turns off transistor 118, allowing a low input signal IN to be passed to delay circuit 72. A low ctr1c signal turns on transistor 114 and turns off transistor 119, thus allowing a high input signal IN to be passed to delay circuit 72. Thus, since inverter 111 inverts input signal IN once, and the inverter comprising transistors 113 and 116 inverts the input signal again, a combination of ctr1B high and ctr1c low enables the clock doubling feature of polarity control circuit C.

As shown in the truth table of FIG. 11a, if ctr1B and ctr1C are both low, P-channel transistors 114 and 118 are turned on, and circuit C outputs a high signal. If ctr1B and ctr1c are both high, N-channel transistors 115 and 119 are turned on, and circuit C outputs a low signal. If ctr1B is high and ctr1C is low, transistors 118 and 119 are turned off, and transistors 114 and 115 are turned on. Thus circuit C switches in response to input signal IN and implements the clock doubler feature. The state of ctr1B low and ctr1C high would cause contention and is not allowed.

FIGS. 12 and 13 shows two possible well known structures for implementing delay element 80. Although FIG. 12 shows three series inverters, other odd numbers of inverters can be used, and the inverters can be manufactured with selected sizes so that a desired amount of delay is achieved. Alternatively, as shown in FIG. 13, a delay element, also with the desired amount of delay, can be manufactured using an RC circuit with a resistor in the data path and a capacitor connected to power or ground.

FIGS. 14 and 15 show structures similar to FIGS. 7 and 8 except that pass gates have been replaced with transmission gates in order to achieve full rail to rail voltage swings. In FIG. 14 pass transistors 3 and 4 of FIG. 7 are supplemented with P-channel pass transistors 8 and 9. P-channel transistors 8 and 9 are driven with the opposite polarity of N-channel transistors 3 and 4.

In FIG. 15, the inverting path is provided by the CMOS inverter comprising transistors 82 and 83, just as in FIG. 8, so the change from FIG. 8 is simply adding P-channel transistor 9 to N-channel transistor 4 to form a transmission gate.

Figure 16:
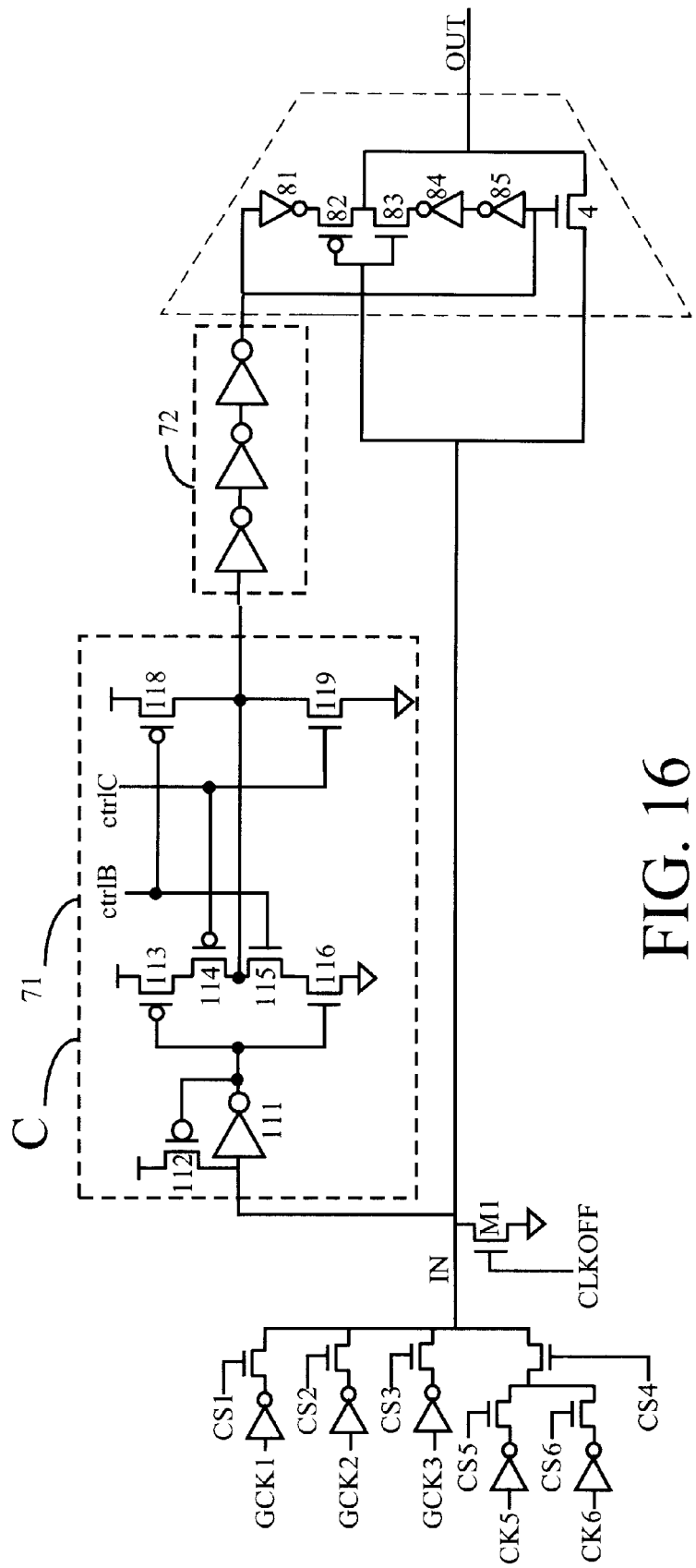
FIG. 16 shows an application using the circuit of FIG. 8, the polarity control circuit of FIG. 11, and the delay circuit of FIG. 12.

FIG. 16 shows an application using the circuit of FIG. 8, the polarity control circuit of FIG. 11, and the delay circuit of FIG. 12 for selecting several sources of a clock signal or turning off the clock signal. Clock select signals CS1 through CS4 can be controlled to enable one of the clock paths. Bringing high one of CS1–CS3 enables the clock signal to be taken from GCK1 through GCK3. If clock select signal CS4 is high, one of clock select signals CS5 and CS6 can be brought high to select CK5 or CK6. If none of CS1 through CS4 is high, no clock signal is selected, and CLKOFF can be brought high to turn on master off transistor M1 to bring input signal IN permanently low. Output signal OUT is then permanently in a state selected by polarity selector 71. Other embodiments of the invention can be combined with the same or different circuit elements to produce other useful devices.

From the above description it can be seen that the invention can be implemented in many embodiments. The circuit of the invention is advantageously used to polarize or double a clock signal from a selectable source when the source of input signal IN is selected by a clock multiplexer with several input signals. The circuit of the invention may also be used broadly for any circuit that requires the functionality of a dual-edge pulse generator having polarity control at very high speed.

What is claimed is:

1. A frequency doubling pulse generator with fast optional inversion comprising:
   a terminal for receiving an input signal;
   a terminal for providing an output signal;
   a first path for carrying the input signal from the input terminal to the output terminal;
   a second path for inverting the input signal at the input terminal and providing the inverse of the input signal at the output terminal; and
   a doubling circuit for both selecting between the first and second paths and doubling the frequency of the input signal, the doubling circuit comprising:
   control elements for selecting the first and second paths; and
   a polarity selector and a delay element connected in series between the input terminal and the control elements.

2. The frequency doubling pulse generator of claim 1 wherein the control elements for selecting the first and second paths comprise:
   a pass transistor controlled by an inverter for selecting the first path; and
   a pass transistor for selecting the second path.

3. The frequency doubling pulse generator of claim 2 wherein the pass transistor for selecting the first path and the pass transistor for selecting the second path each comprise a transmission gate comprising two pass transistors connected in parallel.

4. The frequency doubling circuit of claim 1, wherein:
   the control element for selecting the first path comprises a pass transistor for selecting the first path; and
   the control element for selecting the second path comprises an inverter in the second path, the inverter having power terminals controlled by the polarity selector and the delay element.

5. The frequency doubling pulse generator of claim 4 wherein:
   the pass transistor for selecting the first path comprises a transmission gate; and
   the inverter in the second path has a positive supply terminal driven by one inverter controlled by the polarity selector and the delay element, and a negative supply terminal driven by two inverters in series driven by the polarity selector and the delay element.

6. A clock pulse generator comprising:

a pair of inverted and non-inverted paths, one of which is selected for passing and responding to change in an input signal;

a delay circuit for switching the selected path between the inverted and non-inverted paths after a delay has passed since the input signal switched; and a doubling circuit coupled to the inverted and non-inverted paths, the doubling circuit for doubling the frequency of the input signal.

7. A clock pulse generator comprising:

a pass transistor coupled between an input terminal and an output terminal;

an inverter coupled between the input and output terminals, the inverter having a first power terminal coupled to a gate of the pass transistor and having a second power terminal; and a doubling circuit coupled to the first and second power terminals, the doubling circuit for doubling the frequency of an input signal provided to the input terminal.

8. The clock pulse generator of claim 7, wherein the inverter comprises an PMOS transistor and an NMOS transistor connected in series between the first and second power terminals.

9. The clock pulse generator of claim 7, wherein the doubling circuit comprises a polarity selector and a delay element connected in series between the input terminal and the first and second power terminals of the inverter.

10. The clock pulse generator of claim 7, wherein the doubling circuit comprises a selectable power supply that switches polarities of the first and second power terminals of the inverter in response to changes in the input signal.

11. The clock pulse generator of claim 7, further comprising a second inverter and a third inverter coupled in series between the doubling circuit and the first power terminal.

12. The clock pulse generator of claim 11, further comprising a fourth inverter coupled between the doubling circuit and the first power terminal.

* * * * *